(12) United States Patent
Kwon et al.

(10) Patent No.: US 9,397,199 B1
(45) Date of Patent: Jul. 19, 2016

(54) METHODS OF FORMING MULTI-VT III-V TFET DEVICES

(71) Applicant: GLOBALFOUNDRIES INC., Grand Cayman (KY)

(72) Inventors: Unoh Kwon, Fishkill, NY (US); Siddarth A. Krishnan, Newark, CA (US); Vijay Narayanan, New York, NY (US); Jeffrey Sleight, Ridgefield, CT (US)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 14/992,209

(22) Filed: Jan. 11, 2016

(51) Int. Cl.
| | |
|---|---|
| *H01L 21/76* | (2006.01) |
| *H01L 29/66* | (2006.01) |
| *H01L 21/762* | (2006.01) |
| *H01L 21/268* | (2006.01) |
| *H01L 29/51* | (2006.01) |
| *H01L 21/02* | (2006.01) |
| *H01L 21/306* | (2006.01) |
| *H01L 21/28* | (2006.01) |

(52) U.S. Cl.
CPC .... *H01L 29/66795* (2013.01); *H01L 21/02252* (2013.01); *H01L 21/02351* (2013.01); *H01L 21/2686* (2013.01); *H01L 21/28185* (2013.01); *H01L 21/30604* (2013.01); *H01L 21/76224* (2013.01); *H01L 29/511* (2013.01)

(58) Field of Classification Search
CPC ................ H01L 21/76224; H01L 21/823431; H01L 2924/0002; H01L 29/0649; H01L 29/66795
USPC .......................................... 438/424; 257/343
See application file for complete search history.

(56) References Cited

U.S. PATENT DOCUMENTS

| | | | |
|---|---|---|---|
| 9,136,363 B2 | 9/2015 | Park et al. | |
| 2006/0071285 A1* | 4/2006 | Datta ............... | H01L 21/823807 257/407 |
| 2014/0124827 A1 | 5/2014 | Holz et al. | |
| 2014/0131808 A1* | 5/2014 | Ando ............... | H01L 21/823842 257/369 |
| 2014/0346564 A1 | 11/2014 | Doornbos et al. | |

* cited by examiner

*Primary Examiner* — Theresa T Doan
(74) *Attorney, Agent, or Firm* — David Cain; Hoffman Warnick LLC

(57) ABSTRACT

The disclosure generally relates to a method for forming multiple III-V Tunnel Field-Effect Transistors (III-V TFETs) microchips in which each TFET has a different threshold voltage (Vt) or work-function. In one embodiment of the disclosure, four TFETs are formed on a substrate. Each TFET has a source, drain and a gate electrode. Each gate electrode is then processed independently to provide a substantially different threshold voltage. Each TFET will have an intrinsic channel.

1 Claim, 6 Drawing Sheets

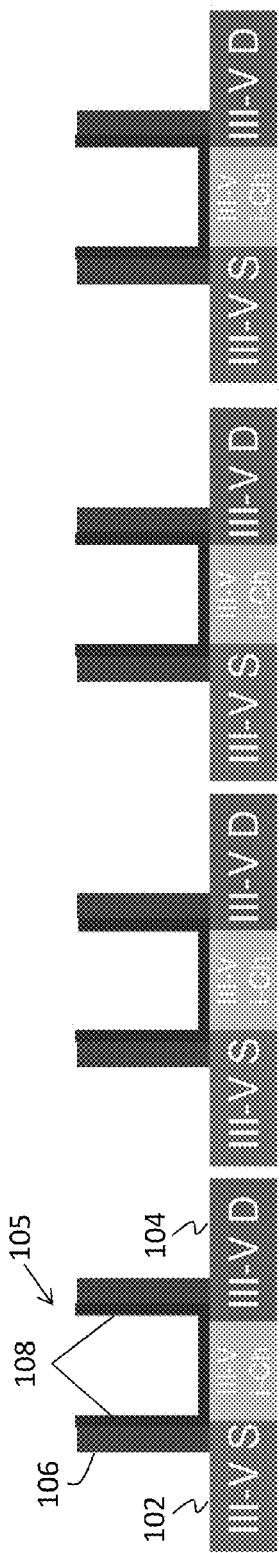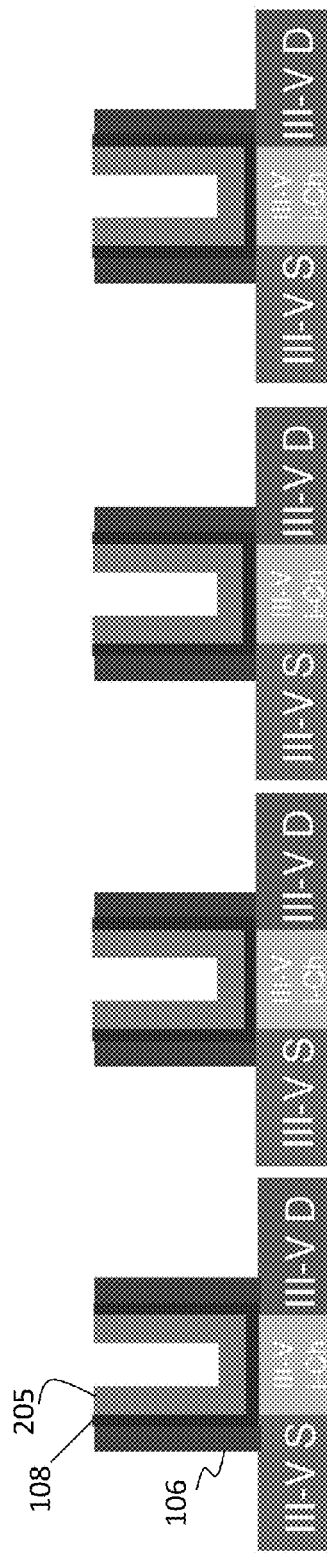

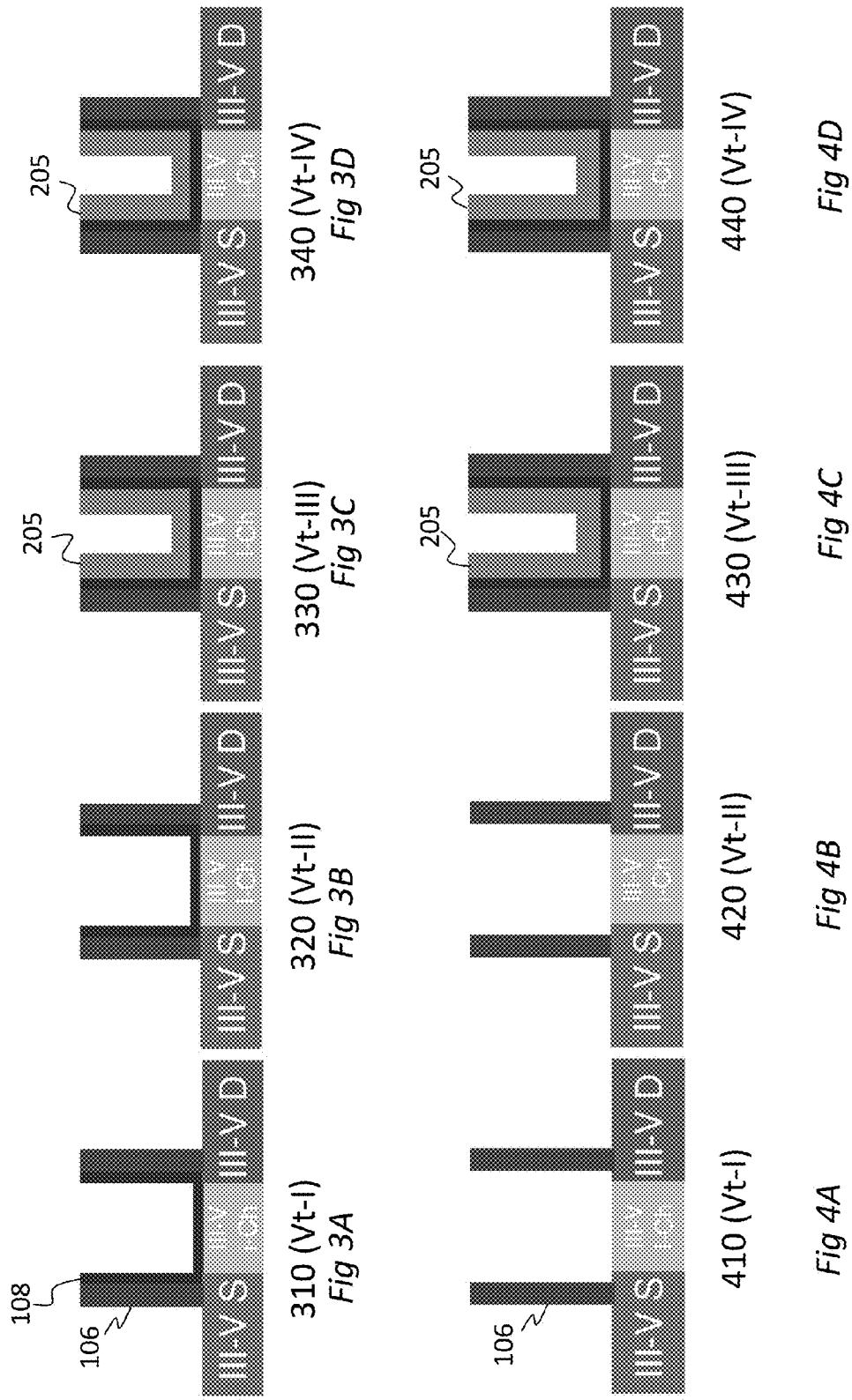

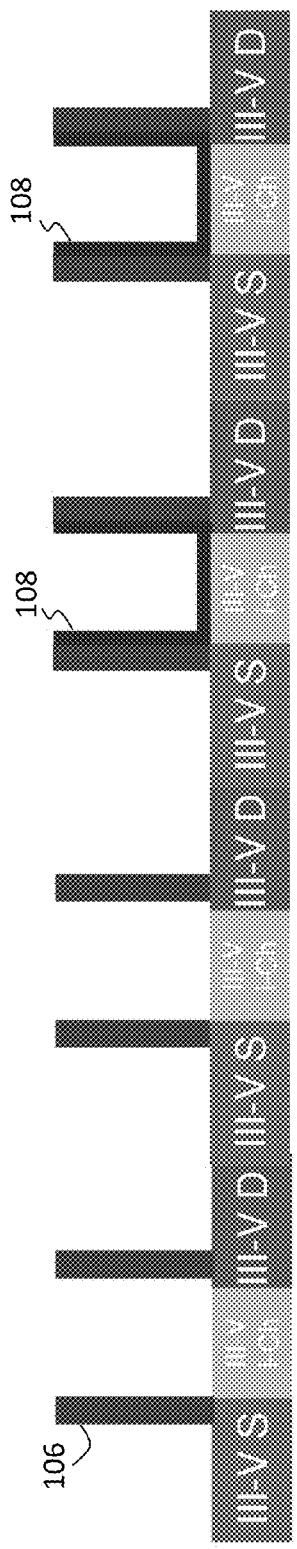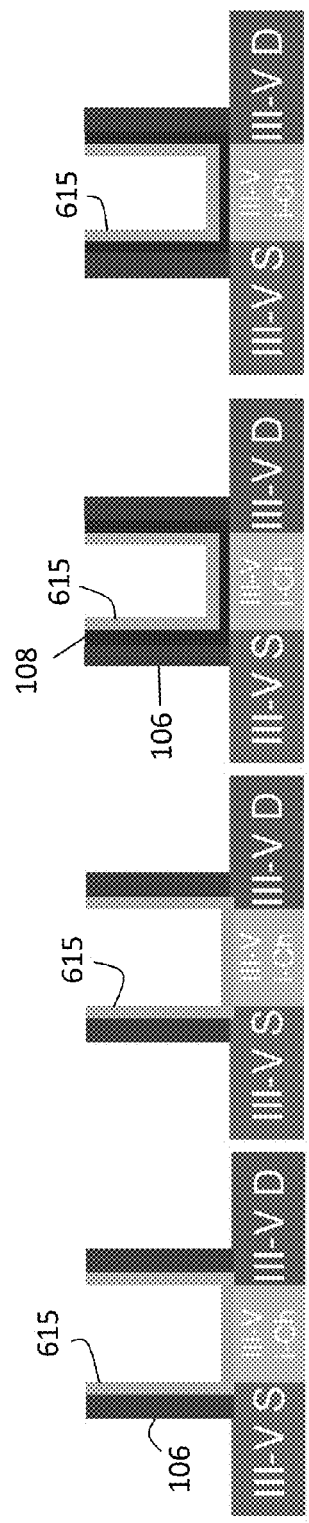

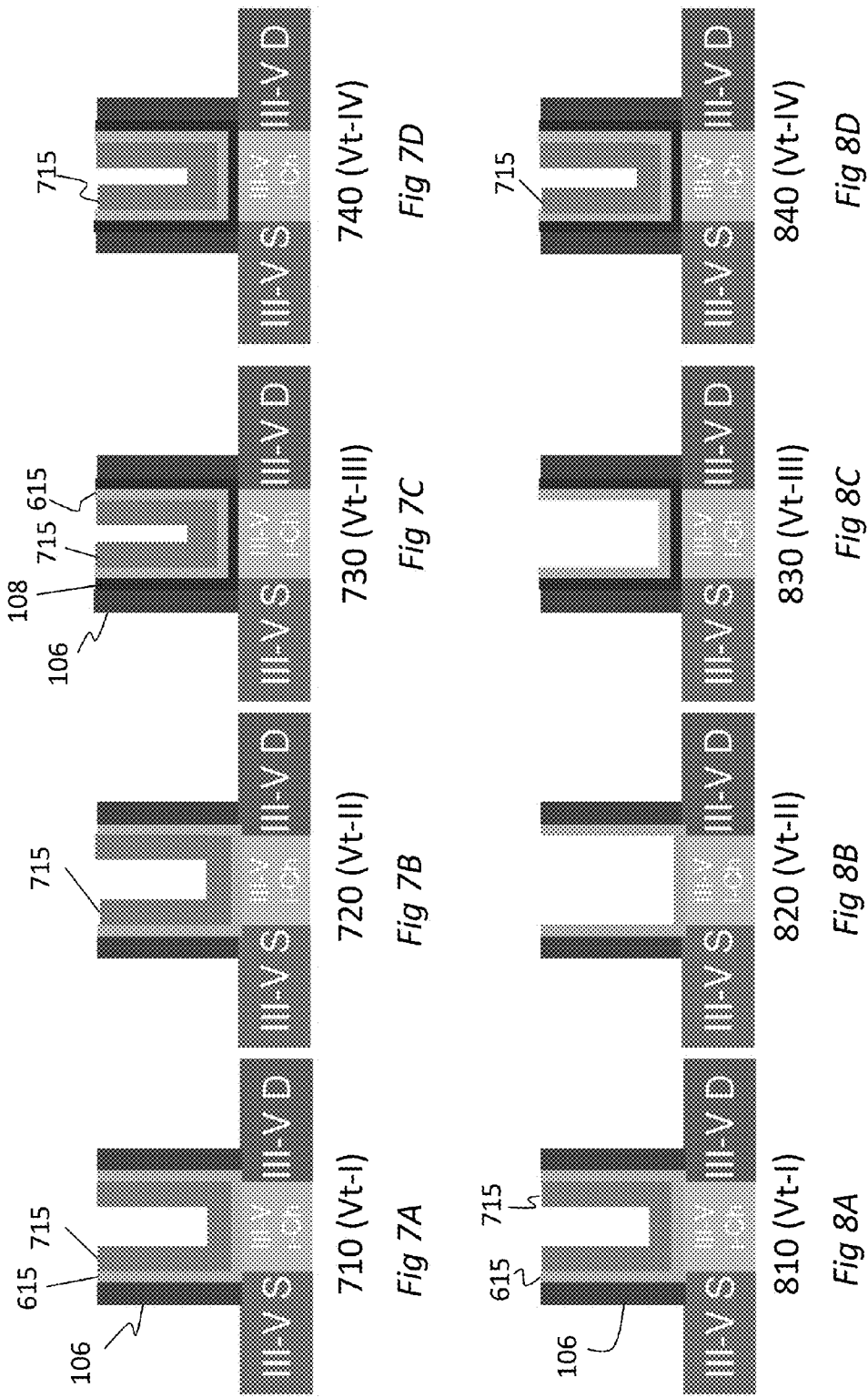

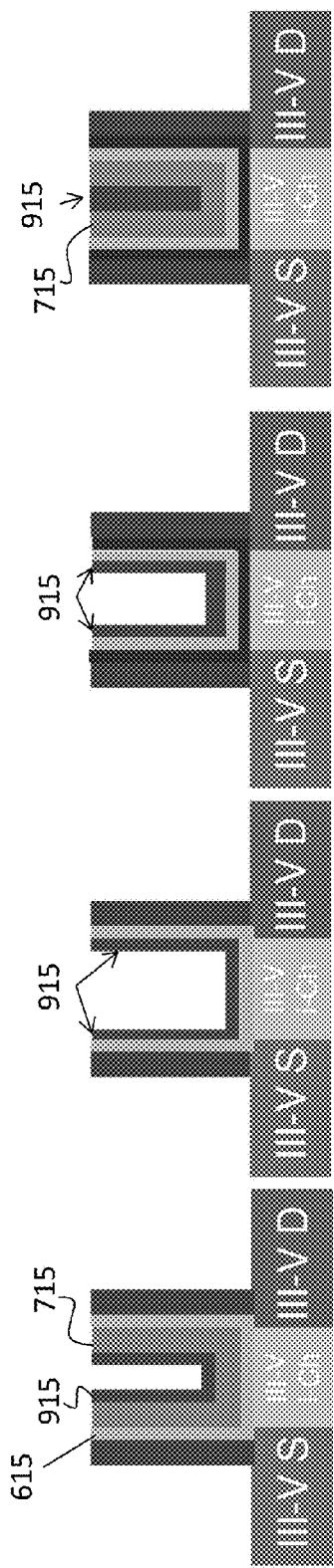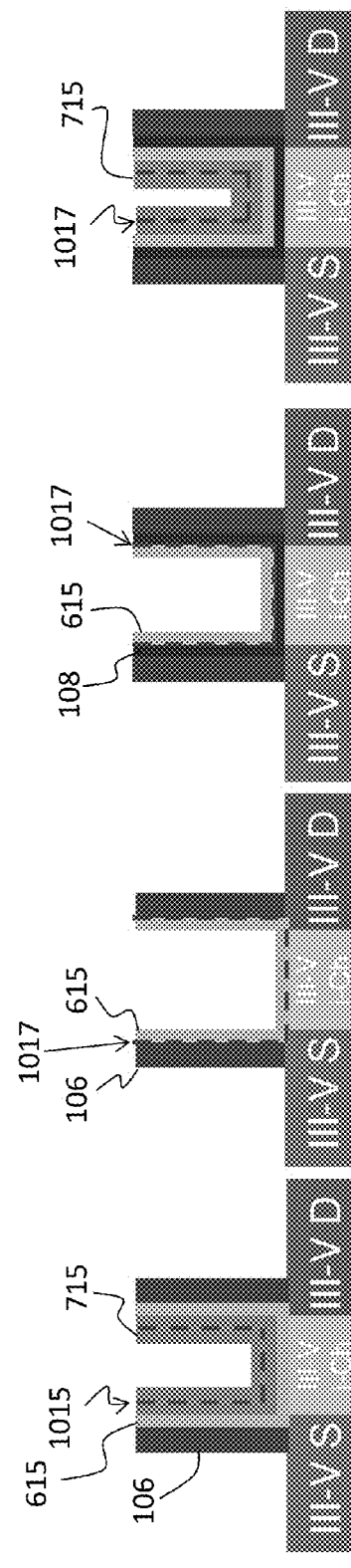

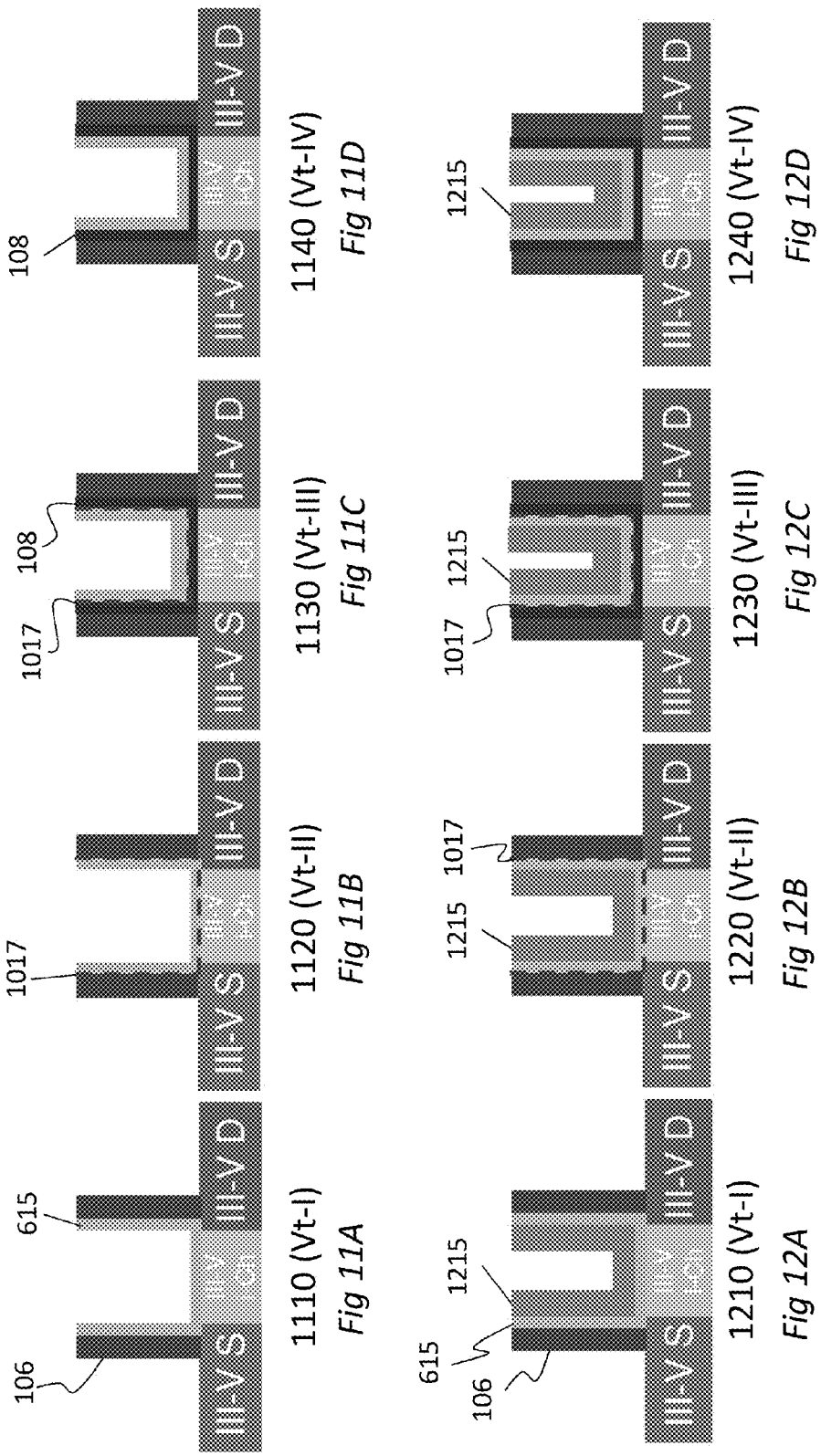

US 9,397,199 B1

METHODS OF FORMING MULTI-VT III-V TFET DEVICES

BACKGROUND

1. Field

The disclosure relates to a method to provide Tunnel Field-Effect Transistor (TFT) devices having multiple threshold voltages (Vt).

2. Description of Related Art

The III-V based Tunneling Field-Effect Transistor (TFET) refer to Field-Effect Transistor (FET) devices in which the Silicon (Si) channel is replaced with a material selected from groups III-V of the Periodic Table of Elements. The TFET is known as steep slope transistor in which the sub-threshold swing (SS) can be steeper than 60 mV/decade. Devices with steeper sub-threshold swings than the MOSFET can meet OFF current requirements at lower supply voltages thereby having lower OFF state leakage. Such devices include FETs in which the channel comprises InGaAs or InAs. The material in group III-V of the Periodic Table have higher mobility compared to Si. Consequently, III-V based TFETs may provide transistors with significantly faster switching. The conventional technology does not provide solutions to enable multi threshold voltage (multi-Vt) devices for III-V TFETs with intrinsic channel. There is a need for method for forming multi-Vt TFT devices.

BRIEF DESCRIPTION OF THE DRAWINGS

These and other embodiments of the disclosure will be discussed with reference to the following exemplary and non-limiting illustrations, in which like elements are numbered similarly, and where:

FIG. 1A-1D schematically illustrate forming a multi-work function device according to one embodiment of the disclosure;

FIGS. 2A-2D schematically illustrate patterning of a first barrier metal layer deposition on all gate electrodes of the device;

FIGS. 3A-3D schematically illustrate removing some of the gate electrodes by selectively removing the first barrier metal layer patterning from two of the four gate electrodes;

FIGS. 4A-4D schematically illustrate selectively removing the first gate oxide layer from two of the four gate electrodes;

FIGS. 5A-5D schematically illustrate selectively removing the first barrier metal layer from two of the four gate electrodes;

FIGS. 6A-6D schematically illustrate depositing a second dielectric layer on all gate electrodes;

FIGS. 7A-7D schematically illustrate depositing a second barrier metal layer on all gate electrodes;

FIGS. 8A-8D schematically illustrate patterning of the second barrier metal layer from two of the four gate electrodes;

FIGS. 9A-9D schematically illustrate depositing a third dielectric layer on all gate electrodes;

FIGS. 10A-10D schematically illustrate capping the stacks and annealing each of the four gate electrodes;

FIGS. 11A-11D schematically illustrate removing the adjacent layers for each gate electrode; and FIGS. 12A-12D schematically illustrate depositing a final metal layer on each of the four gate electrodes.

DETAILED DESCRIPTION

The conventional processes do not provide a solution to enable multiple threshold voltage (multi-Vt) devices for TFETs with intrinsic channel. To overcome this and other shortcoming, an embodiment of the disclosure provides a method to grow thin intrinsic low bandgap InAs or InGaAs blanket III-V on SiGe or SiGe on insulator. The layer thinness may be just below the critical thickness or just above. In one embodiment, an NP junction is formed. In another embodiment, the conventional replacement gate flow technique is used to remove dummy gate structures. In still another embodiment, multiple ALD gage dielectrics (with different polarity in dipole formation) are used to enable 3 or 4 multi WF III-V TFET devices. The following figures illustrate an exemplary embodiment in which four ALD gate dielectrics are formed according to the disclosed embodiments.

FIG. 1A-1D schematically illustrate the first processing step for multi-work function device according to one embodiment of the disclosure. As a first step, four III-V TFET device devices are formed each having a source, a drain and a gate electrode. After a dummy gate is removed, a spacer is formed over each gate electrode. The spacer is shown as spacer 106 in FIG. 1A. FIG. 1A also shows the first III-V TFET device 110, Second III-V TFET device 120, third III-V TFET device 130 and fourth III-V TFET device 140. First III-V TFET device 110 operates at a first threshold voltage (Vt-I), second III-V TFET device 120 operates at a second threshold voltage (Vt-II), third III-V TFET device 130 operates at a third threshold voltage (Vt-III) and fourth III-V TFET device 140 operates at a fourth threshold voltage (Vt-IV). Each III-V TFET device further comprises a source electrode, a drain electrode and a gate electrode. These electrodes are shown in FIG. 1A as source electrode 102, drain electrode 104 and gate electrode 105. For brevity, all source electrodes are marked as 'S' and all drain electrodes are marked as 'D'. The gate channels are marked as 'i-Ch'. To form four different gate dielectric layers, each of the gate layers of FIGS. 1A-1D is deposited with a first gate oxide layer 108. In one embodiment, atomic layer deposition (ALD) technique is used to deposit $Al_2O_3$ as the first gate oxide layer 108.

FIGS. 2A-2D schematically illustrate patterning of a first barrier metal layer 205 deposition. Here, first barrier metal layer 205 is deposited over the first gate oxide layer 108 for each of the four III-V TFET devices 210, 220, 230 and 240. Exemplary first barrier metal layers 205 include TiN, TaN, TiC or TaC.

FIGS. 3A-3D schematically illustrate removing the first barrier metal layer 205 from some of the III-V TFET devices. Specifically, in FIGS. 3A and 3B, the first barrier metal layer 205 is removed from III-V TFET devices 310 and 320. In an exemplary embodiment, a hard mask (HM) or soft mask (SM) may be used to protect the unaffected devices 330 and 340.

FIGS. 4A-4D schematically illustrate removal of the first gate oxide layer 108 (e.g., $Al_2O_3$) from some of the gate electrodes 105 (see, FIGS. 1A-1D). Specifically, the first gate oxide layer 108 is removed from devices 410 and 420. The first gate oxide layer 108 of devices 430 and 440 remain intact. A hard mask (HM) or soft mask (SM) may be used to protect the unaffected devices 430 and 440.

FIGS. 5A-5D schematically illustrate removal of the first barrier metal layers 205 (see, FIGS. 4C and 4D) from devices 530 and 540. Thus, each of devices 530 and 540 is left with the first gate oxide layer 108.

FIGS. 6A-6D schematically illustrate deposition of a second dielectric layer 615 on all four devices 610, 620, 630 and 640. The second dielectric layer 615 may comprise $HFO_2$. III-V TFET devices 610 and 620 are shut shown with second dielectric layer 615. III-V TFET devices 630 and 640 are shown with the first gate oxide layer 108 and second dielectric layer 615.

FIGS. 7A-7D schematically illustrate selective deposition of the second barrier metal layer 715 on all gate electrodes 105 (see, FIGS. 1A-1D). Here, a second barrier metal layer 715 is deposited in each of devices 710, 720, 730 and 740. The second barrier metal layer 715 may comprise any conventional metal layer as described above. FIGS. 7A and 7B show III-V TFET devices 710 and 720 having second dielectric layer 615 and second barrier metal layer 715. FIGS. 7C and 7D show III-V TFET devices 730 and 740 having first gate oxide layer 108, second dielectric layer 615 and second barrier metal layer 715.

FIGS. 8A-8D schematically illustrate patterning of the second barrier metal layer 715 from two of the III-V TFET devices. Specifically, the second barrier metal layer 715 is removed from III-V TFET devices 820 and 830. III-V TFET devices 810 and 840 remain untouched as they may be covered by hard masks (HM).

FIGS. 9A-9D schematically illustrate the third dielectric layer 915 formation. The deposition may be done by atomic layer deposition (ALD). In one embodiment, the third dielectric layer 915 may comprise $La_2O_3$. The deposition may be done on every gate electrode 105 for each device 910, 920, 930 and 940. Each of gate electrodes 105 of the III-V TFET devices 910, 920, 930 and 940 includes third dielectric layer 915.

FIGS. 10A-10D schematically illustrate capping the stacks and annealing the stacks. During the annealing, the third dielectric layer 915 (see, FIGS. 9A-9D) may start to diffuse. However, the diffusion is stopped in gate electrodes 105 due to the presence of adjacent layers (e.g., the second dielectric layer 615 and/or the second barrier metal layer 715) where the diffusion is trapped in the adjacent layers (as illustrated by dashed lines 1015 and 1017). In FIG. 10B the diffusion drives the third dielectric layer 915 through the second dielectric layer 615. In FIG. 10C, diffusion is trapped between first gate oxide layer 108 and second dielectric layer 615. In one embodiment, the third dielectric layer 915 may diffuse through at FIGS. 10B and 10C. The diffusion barriers are schematically illustrated as lines 1015 and 1017.

FIGS. 11A-11D schematically illustrate the removal of the adjacent layers (e.g., the second dielectric layer 615 and/or the second barrier metal layer 715) for each gate electrode 105 for each of the devices 1110, 1120, 1130 and 1140. In one exemplary implementation, all HM and metal masks are removed as well as the adjacent layers. Any of the third dielectric layer 915 which may have been trapped in the adjacent layers is now substantially removed.

FIGS. 12A-12D schematically illustrate the step of depositing a final metal layer 1215 on each of the III-V TFET devices 1210, 1220, 1230 and 1240. The gate electrodes 105 (see, FIGS. 1A-1D) with four different gate dielectrics provide four different FETs with each FET having a different gate electrode threshold voltage.

It should be noted that while the disclose embodiments only show four III-V TFET devices, the disclosed principles are not limited thereto. Other implementations having more or less TFET on the same substrate may be implemented without departing from the disclosed principles. The disclosed embodiments grow thin intrinsic low bandgap InAs or InGaAs blanket of material from the III-V periodic table on SiGe or SiGe in insulator. The disclosed embodiments, form PN junctions and follow standard replacement gate flow to remove dummy gate structure. The disclosed embodiments utilize multiple ALD gate dielectrics (with different polarity in dipole formation) to enable multiple workforce Tunnel FET (TFET) devices While the principles of the disclosure have been illustrated in relation to the exemplary embodiments shown herein, the principles of the disclosure are not limited thereto and include any modification, variation or permutation thereof.

What is claimed is:

1. A method to form a device having multiple tunnel field-effect transistors (TFETs) with each TFET having a different work-function, the method comprising:
    forming a first, second, third and fourth TFET device, each TFET device having a source electrode, a drain electrode and a gate electrode and each gate electrode having a dipole formation layer and a first gate oxide layer;
    forming a first barrier metal layer over the first gate oxide layer for each of the first, second, third and fourth III-V TFET devices;
    removing the first barrier metal layer from each of the first III-V TFET device and the second III-V TFET device;
    removing the first gate oxide layer from the first III-V TFET device and the second III-V TFET device;
    removing the first barrier metal layer from the third III-V TFET device and the fourth III-V TFET device;
    depositing a second dielectric layer over each of the first, second, third and fourth III-V TFET devices, the second dielectric layer comprising $HFO_2$;
    depositing a second barrier metal layer over each of the first, second, third and fourth III-V TFET devices;
    removing the second barrier metal layers from each of the second III-V TFET device and third III-V TFET device;
    depositing a third dielectric layer over each of the first, second, third and fourth III-V TFET devices, the third dielectric layer comprising $La_2O_3$;
    annealing each of the first, second, third and fourth III-V TFET devices to diffuse the third dielectric layer into one or more adjacent layers;
    removing the third dielectric layer from each of the first, second, third and fourth III-V TFET devices; and
    depositing a final metal layer over each of the first, second, third and fourth III-V TFET devices layers to form four TFETs with each TFET having a different threshold voltage.

* * * * *